(12) United States Patent
Nakamura et al.

(10) Patent No.: US 7,544,589 B2
(45) Date of Patent: Jun. 9, 2009

(54) WAFER DIVIDING METHOD

(75) Inventors: Masaru Nakamura, Tokyo (JP); Yusuke Nagai, Tokyo (JP)

(73) Assignee: Disco Corporation, Tokyo (JP)

( * ) Notice: Subject to any disclaimer, the term of this patent is extended or adjusted under 35 U.S.C. 154(b) by 322 days.

(21) Appl. No.: 11/472,285

(22) Filed: Jun. 22, 2006

(65) Prior Publication Data

US 2007/0004179 A1   Jan. 4, 2007

(30) Foreign Application Priority Data

Jun. 30, 2005   (JP) .............................. 2005-191914

(51) Int. Cl.
*H01L 21/46* (2006.01)
*H01L 21/78* (2006.01)
*H01L 21/301* (2006.01)

(52) U.S. Cl. ..................... 438/463; 438/60; 438/75; 438/14; 257/E21.596; 257/E21.598; 257/E21.599

(58) Field of Classification Search ................ 438/463, 438/462, 30, 31, 32, 60, 75
See application file for complete search history.

(56) References Cited

U.S. PATENT DOCUMENTS 7,446,020 B2 * 11/2008 Nakamura ................. 438/460

2005/0009301 A1 *  1/2005  Nagai et al. ................ 438/463
2008/0057680 A1 *  3/2008  Watanabe ................... 438/463
2008/0124898 A1 *  5/2008  Kobayashi ................. 438/463

FOREIGN PATENT DOCUMENTS

JP       3408805       3/2003

* cited by examiner

*Primary Examiner*—David Nhu
(74) *Attorney, Agent, or Firm*—Smith, Gambrell & Russell, LLP

(57) ABSTRACT

A method of dividing a wafer having a plurality of devices, which are formed in a plurality of areas sectioned by streets formed in a lattice pattern on the front surface and test metal patterns which are formed on the streets, having a metal pattern breaking step for forming a break line in the test metal patterns by applying a pulse laser beam having permeability to the wafer to the rear surface of the wafer with its focal point set near the test metal patterns; a deteriorated layer forming step for forming a deteriorated layer along the streets above the break lines in the inside of the wafer by applying a pulse laser beam having permeability to the wafer to the rear surface of the wafer with its focal point set to a position above the break lines in the inside of the wafer; and a dividing step.

1 Claim, 6 Drawing Sheets (a)

(b)

(a)

(b)

WAFER DIVIDING METHOD

FIELD OF THE INVENTION

The present invention relates to a method of dividing a wafer having a plurality of devices, which are formed in a plurality of areas sectioned by streets formed in a lattice pattern on the front surface thereof, and having test metal patterns which are formed on the streets along the streets.

DESCRIPTION OF THE PRIOR ART

As known to people of ordinary skill in the art, in the production process of a semiconductor device, individual semiconductor chips are manufactured by cutting a semiconductor wafer comprising devices such as IC's or LSI's which are formed in a plurality of areas sectioned by break lines called "streets" arranged in a lattice pattern on the front surface of a substantially disk-like semiconductor substrate, along the streets to divide it into the areas each having a device formed thereon.

Most of the above semiconductor wafers have a plurality of test metal patterns called "test element group (TEG)" for testing the function of each device on the streets. Before the semiconductor wafer having the test metal patterns is divided into individual semiconductor chips, the function of each device is checked by using the test metal patterns. The test metal patterns are cut and removed simultaneously at the time when the semiconductor wafers are divided. That is, when the test metal patterns remain, there is a possibility that the constitution of each device is detected from the metal patterns. Therefore, the test metal patterns are removed from the standpoint of keeping a company secret.

Meanwhile, as a means of dividing a plate-like workpiece such as a semiconductor wafer, a laser processing method in which a pulse laser beam of a wavelength having permeability to the workpiece is applied with its focal point set to the inside of the area to be divided is attempted nowadays, and disclosed by Japanese Patent No. 3408805. In the dividing method making use of this laser processing technique, the workpiece is divided by applying a pulse laser beam of an infrared range having permeability to the workpiece from one surface side of the workpiece with its focal point set to the inside to continuously form a deteriorated layer in the inside of the workpiece along the streets and exerting external force along the streets whose strength has been reduced by the formation of the deteriorated layers.

When the TEG is formed on the streets of the wafer, however, there is a problem in that the TEG becomes an obstacle to a laser beam, thereby making it impossible to form a deteriorated layer uniformly.

To solve the above problem, a laser beam is applied from the rear surface devoid of TEG of the wafer along the streets, thereby making it possible to form a deteriorated layer uniformly. However, there arises a problem that when the wafer having the deteriorated layers is divided by exerting external force thereto, the TEG is broken like the teeth of a saw, causes contamination and reduces the quality of devices. Further, there remains the problem that the constitution of devices can be detected from the remaining TEG, resulting in the leakage of a company secret.

SUMMARY OF THE INVENTION

It is an object of the present invention to provide a wafer dividing method capable of dividing a wafer into individual devices without being influenced by test metal patterns formed on streets and preventing the constitution of the obtained devices from being detected.

According to the present invention, there is provided a method of dividing a wafer having a plurality of devices, which are formed in a plurality of areas sectioned by streets formed in a lattice pattern on the front surface and having test metal patterns which are formed on the streets, comprising:

a metal pattern breaking step for forming a break line in the test metal patterns by holding the wafer in such a manner that its rear surface faces up and applying a pulse laser beam having permeability to the wafer from the rear surface of the wafer with its focal point set to a position near the test metal patterns along the streets;

a deteriorated layer forming step for forming a deteriorated layer along the streets above the break lines in the inside of the wafer by applying a pulse laser beam having permeability to the wafer from the rear surface of the wafer with its focal point set to a position above the break lines in the inside of the wafer along the streets; and a dividing step for dividing the wafer into individual chips along the deteriorated layers of the wafer by exerting external force to the wafer having the deteriorated layers formed therein.

The pulse laser beam applied in the above metal pattern breaking step has a wavelength of 1,064 nm, a repetition frequency of 20 to 80 KHz and an average output of 0.05 to 0.2 W.

In the wafer dividing method of the present invention, since the plurality of test metal patterns formed on the streets are broken along the streets to form a break line in the test metal patterns by carrying out the metal pattern breaking step, even when the wafer is broken along the deteriorated layers formed by the deteriorated layer forming step, the test metal patterns are not broken like the teeth of a saw. Further, as the test metal patterns are broken and their function is destroyed by the application of a laser beam, the constitution of the devices cannot be detected from the remaining test metal patterns.

DETAILED DESCRIPTION OF THE PREFERRED EMBODIMENTS

Preferred embodiments of the wafer dividing method of the present invention will be described in more detail hereinunder with reference to the accompanying drawings.

Figure 1:
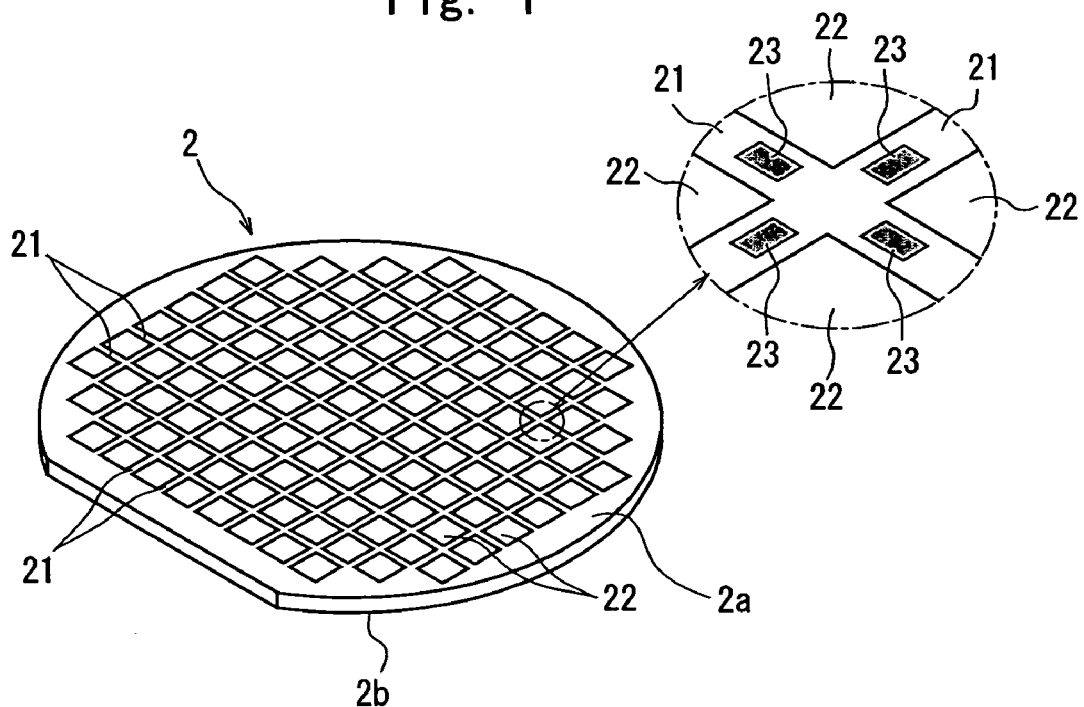
FIG. 1 is a perspective view of a semiconductor wafer to be divided by the wafer dividing method of the present invention.

FIG. 1 is a perspective view of a semiconductor wafer to be divided into individual chips by the wafer dividing method of the present invention. The semiconductor wafer 2 shown in FIG. 1 is a silicon wafer, a plurality of areas are sectioned by a plurality of streets 21 which are arranged in a lattice pattern on the front surface 2a of the semiconductor wafer 2, and a device 22 such as IC or LSI is formed in each of the sectioned areas. A plurality of test metal patterns 23 called "test element group (TEG)" for testing the function of each device 22 are partially formed on the streets 21 of this semiconductor wafer 2.

Figure 2:
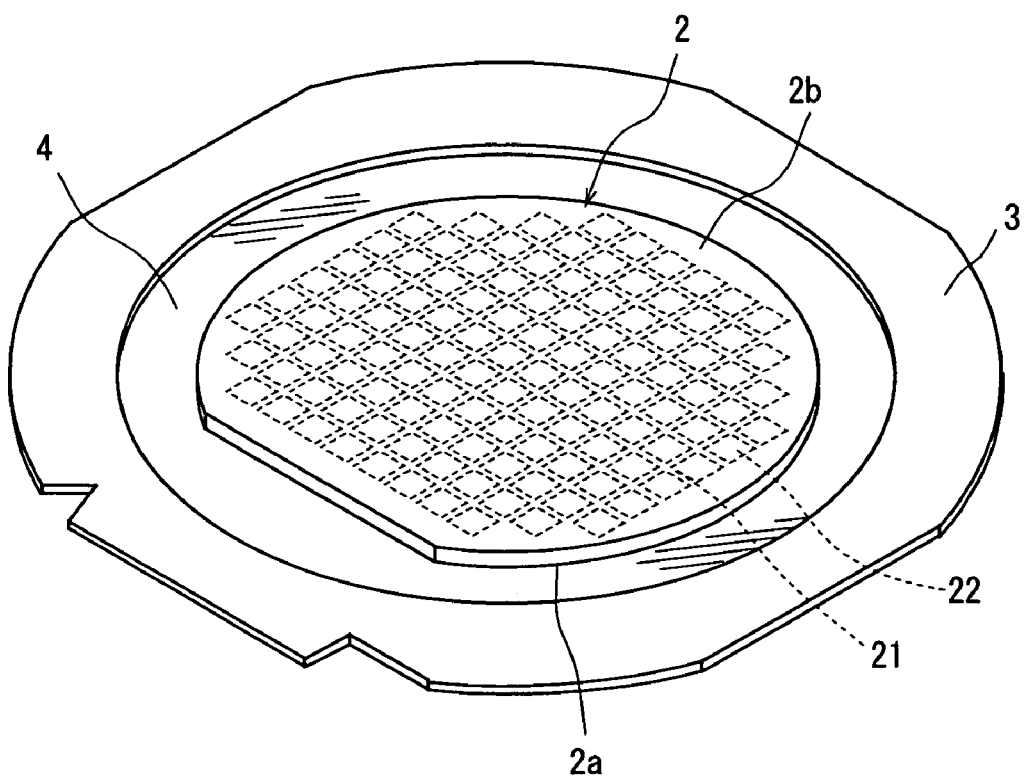
FIG. 2 is a perspective view of the semiconductor wafer shown in FIG. 1 put on the surface of a support tape mounted on an annular frame.

The front surface 2a side of the semiconductor wafer 2 constituted as described above is put on a support tape 4 which is composed of a synthetic resin sheet such as a polyolefin sheet and mounted on an annular frame 3 as shown in FIG. 2. Therefore, the rear surface 2b of the semiconductor wafer 2 faces up.

A description will be first given of the method of dividing the semiconductor wafer 2 along the plurality of streets 21.

First comes a metal pattern breaking step for forming a break line in the test metal patterns 23 by holding the semiconductor wafer 2 in such a manner that the rear surface 2b of the semiconductor wafer 2 faces up and applying a pulse laser beam having permeability to the semiconductor wafer 2 from the rear surface 2b of the semiconductor wafer 2 along the streets 21 with its focal point set to a position near the test metal patterns 23. This metal pattern breaking step is carried out by using a laser beam processing machine shown in FIG. 3. The laser beam processing machine 5 shown in FIG. 3 comprises a chuck table 51 for holding a workpiece and a laser beam application means 52 for applying a laser beam to the workpiece held on the chuck table 51. The chuck table 51 is constituted to suction-hold the workpiece and is designed to be moved in a processing-feed direction indicated by an arrow X in FIG. 3 by a processing-feed mechanism (not shown) and in an indexing-feed direction indicated by an arrow Y by an indexing-feed mechanism that is not shown.

Figure 3:
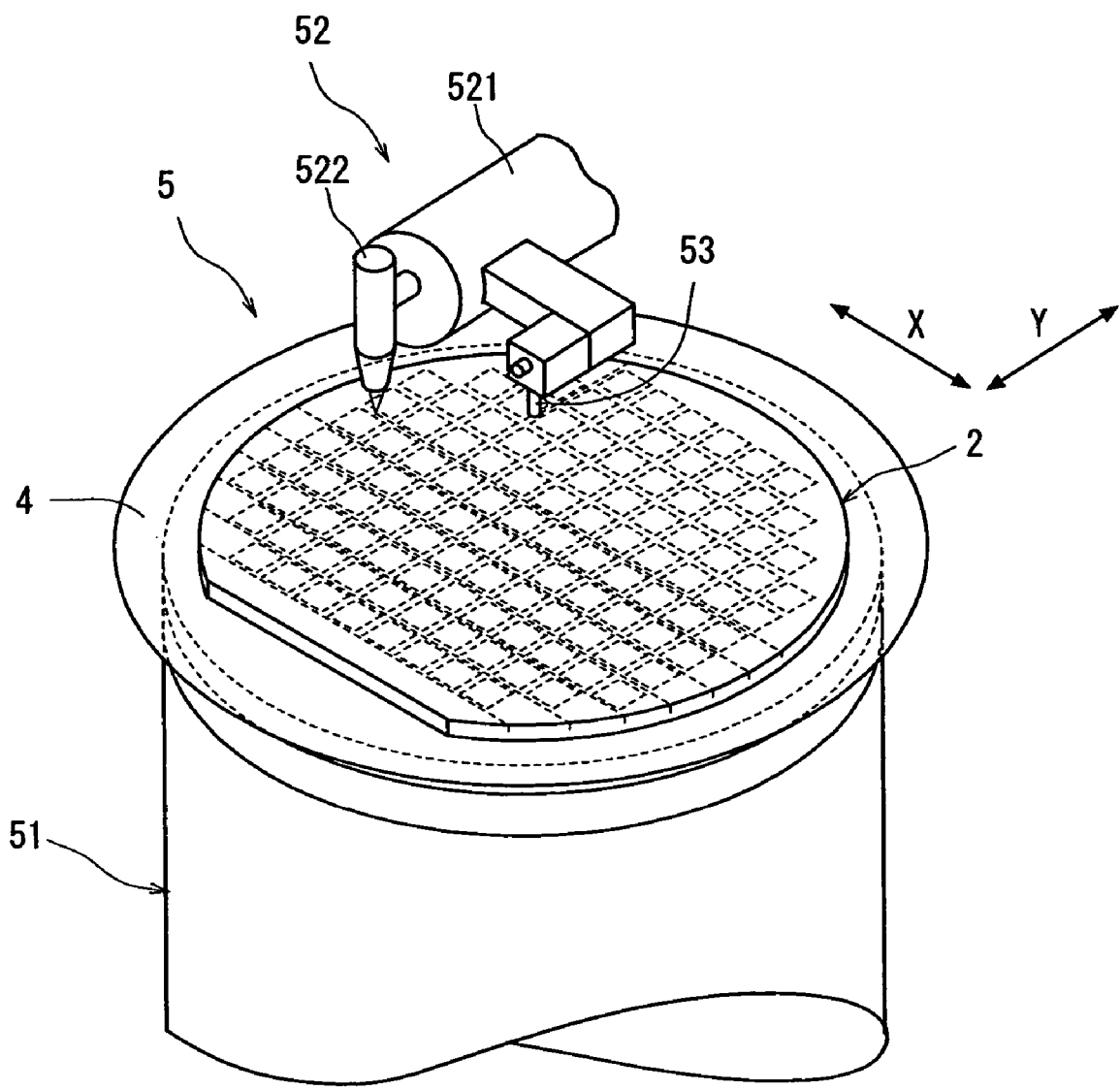
FIG. 3 is a perspective view of the principal portion of a laser beam processing machine for carrying out the metal pattern breaking step and the deteriorated layer forming step in the wafer dividing method of the present invention.

The above laser beam application means 52 applies a pulse laser beam from a condenser 522 mounted on the end of a cylindrical casing 521 arranged substantially horizontally. The illustrated laser beam processing machine 5 comprises an image pick-up means 53 mounted onto the end portion of the casing 521 constituting the above laser beam application means 52, as shown in FIG. 3. This image pick-up means 53 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is supplied to a control means that is not shown.

A description will be subsequently given of the metal pattern breaking step using the above-described laser beam processing machine 5. The semiconductor wafer 2 supported to the annular frame 3 through the support tape 4 is first placed on the chuck table 51 of the laser beam processing machine 5 shown in FIG. 3 and is suction-held on the chuck table 51. At this point, the semiconductor wafer 2 is held in such a manner that the rear surface 2b faces up. Although the annular frame 3 mounting the support tape 4 affixed to the semiconductor wafer 2 is not shown in FIG. 3, the annular frame 3 is fixed by frame holding clamps (not shown) installed on the chuck table 51.

The chuck table 51 suction-holding the semiconductor wafer 2 as described above is brought a position right below the image pick-up means 53 by the processing-feed mechanism that is not shown. After the chuck table 51 is positioned right below the image pick-up means 53, the image pick-up means 53 and the control means (not shown) carry out alignment work for detecting the area to be processed of the semiconductor wafer 2. That is, the image pick-up means 53 and the control means (not shown) carry out image processing such as pattern matching etc. to align a street 21 formed in a predetermined direction of the semiconductor wafer 2 with the condenser 522 of the laser beam application means 52 for applying a laser beam along the street 21, thereby performing the alignment of a laser beam application position. Although the street 21 formed on front surface 2a of the semiconductor wafer 2 positions on the underside at this point, an image of the street 21 can be picked up through the rear surface 2b as the image pick-up means 53 comprises an infrared illuminating means, an optical system for capturing infrared radiation and an image pick-up device (infrared CCD) for outputting an electric signal corresponding to the infrared radiation as described above. The alignment of the laser beam application position is also carried out on streets 21 formed on the semiconductor wafer 2 in a direction perpendicular to the above predetermined direction.

Figure 4:
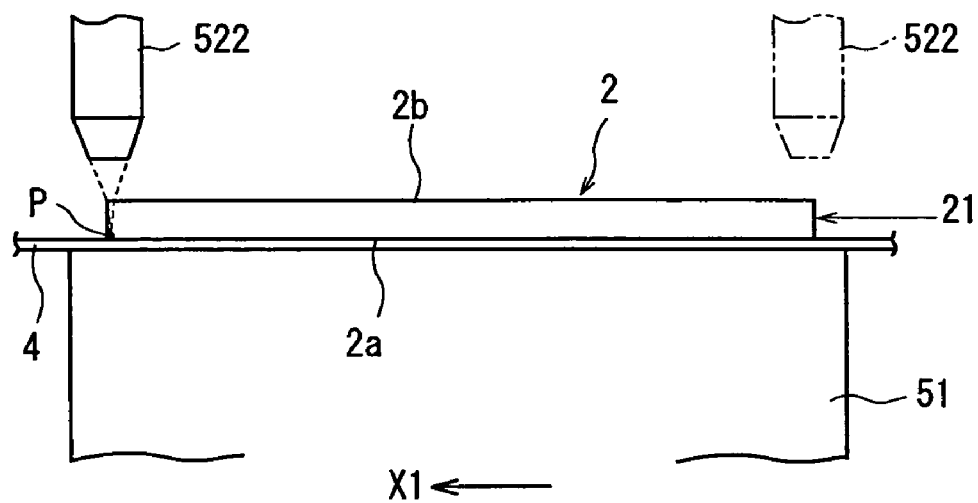
FIGS. 4(a) and 4(b) are explanatory diagrams showing the metal pattern breaking step in the wafer dividing method of the present invention.
Figure 4:
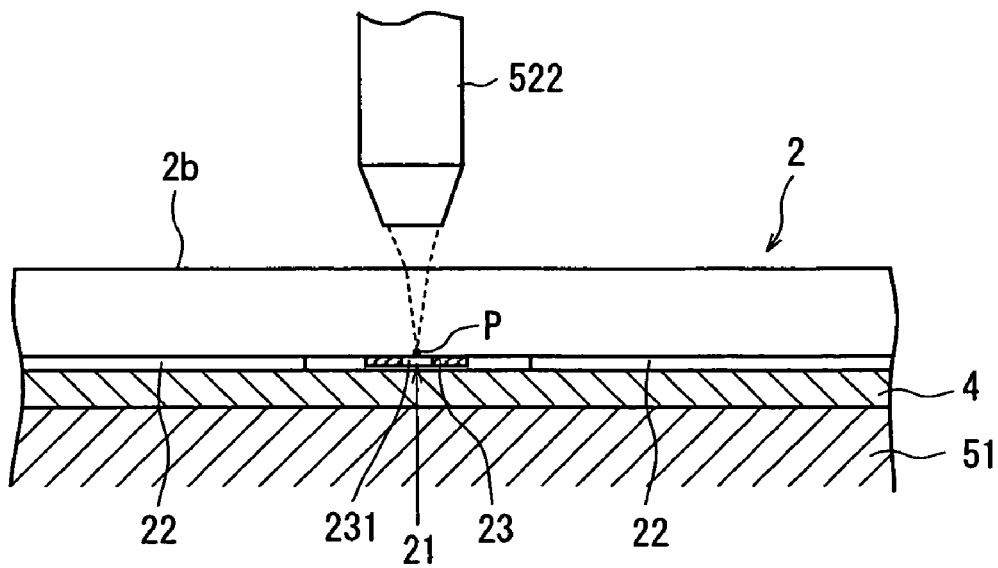

After the street 21 formed on the semiconductor wafer 2 held on the chuck table 51 is detected and the alignment of the laser beam application position is carried out as described above, as shown in FIG. 4(a), the chuck table 51 is moved to a laser beam application area where the condenser 522 of the laser beam application means 52 for applying a laser beam is located to bring one end (left end in FIG. 4(a)) of the predetermined street 21 to a position right below the condenser 522. At this point, the focal point P of the pulse laser beam is set to a position near the front surface 2a of the semiconductor wafer 2, that is, near the test metal pattern 23. The chuck table 51, that is, the semiconductor wafer 2 is then moved in the direction indicated by the arrow X1 in FIG. 4 (a) at a predetermined processing-feed rate while a pulse laser beam of a wavelength having permeability to the semiconductor wafer 2 is applied from the condenser 522. When the application position of the condenser 522 reaches the other end (right end in FIG. 4 (a)) of the semiconductor wafer 2 as shown in FIG. 4(a), the application of the pulse laser beam is suspended, and the movement of the chuck table 51, that is, the semiconductor wafer 2 is stopped. As a result, the test metal patterns 23 are broken and a break line 231 is formed in the test metal patterns 23 along the street 21 as shown in FIG. 4 (b) as the pulse laser beam is applied to the test metal patterns 23 formed on the street 21. Further, the function of the test metal patterns 23 exposed to the pulse laser beam is destroyed.

The processing conditions of the above metal pattern breaking step are set as follows, for example.

Light source of laser beam: YVO4 or YAG laser
Wavelength: 1,064 nm
Repetition frequency: 20 to 80 kHz
Average output: 0.05 to 0.2 W
Focal spot diameter: 1 μm
Processing-feed rate: 300 to 500 mm/sec After the above-described metal pattern breaking step is carried out along all the streets 21 formed in the predetermined direction of the semiconductor wafer 2, the chuck table 51, therefore, the semiconductor wafer 2 is turned at 90°. The above metal pattern breaking step is then carried out along all the streets 21 formed on the semiconductor wafer 2 in a direction perpendicular to the above predetermined direction. As a result, break lines 231 are formed along the streets 21 in all the test metal patterns 23 formed on all the streets 21 of the semiconductor wafer 2.

According to experiments conducted by the inventors of the present invention, when the pulse laser beam applied in the above metal pattern breaking step had a repetition frequency of less 20 kHz and an average output of less than 0.05 W, the metal patterns 23 could not be broken. When the repetition frequency was higher than 80 kHz and the average output was higher than 0.2 W, the metal patterns 23 were destroyed and fine break lines 231 could not be formed. Therefore, the pulse laser beam applied in the metal pattern breaking step should have a repetition frequency of 20 to 80 kHz and an average output of 0.05 to 0.2 W.

The above metal pattern breaking step is followed by the deteriorated layer forming step for forming a deteriorated layer along the streets 21 above the break lines 231 in the inside of the semiconductor wafer 2 by applying a pulse laser beam having permeability to the semiconductor wafer 2 from the rear surface 2b of the semiconductor wafer 2 along the streets 21 with its focal point set to a position above the break lines 231 in the inside of the semiconductor wafer 2.

Figure 5:
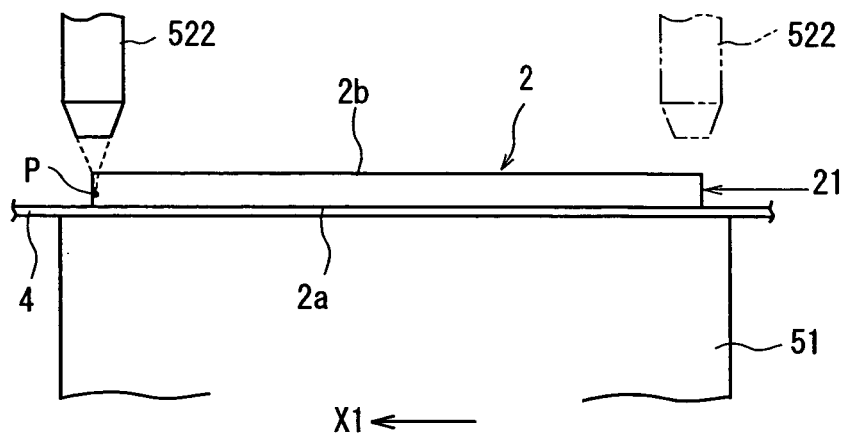
FIGS. 5(a) to 5(c) are explanatory diagrams showing the deteriorated layer forming step in the wafer dividing method of the present invention.
Figure 5:
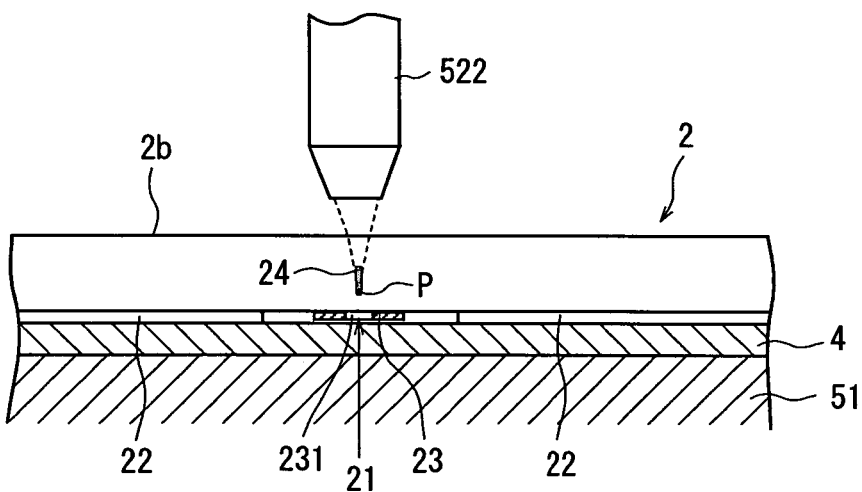
Figure 5:
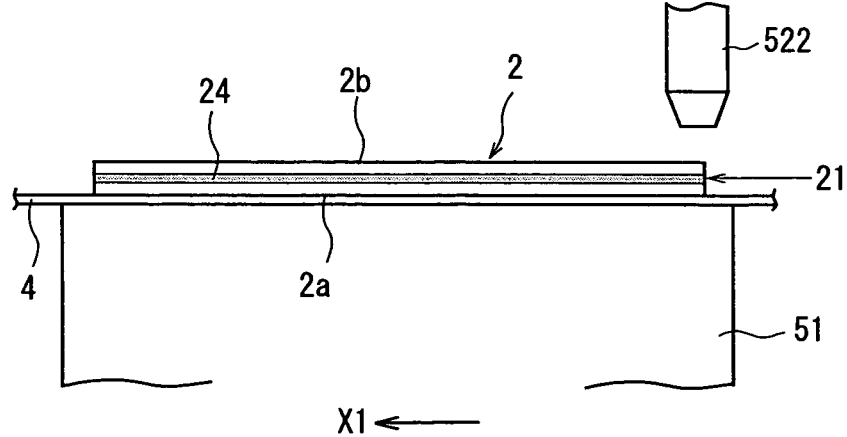

That is, the chuck table 51 is moved to a laser beam application area where the condenser 522 of the laser beam application means 52 for applying a laser beam is located to bring one end (left end in FIG. 5(a)) of a predetermined street 21 to a position right below the condenser 522, as shown in FIG. 5(a). At this point, the focal point P of the pulse laser beam is set to a position above the break line 231 formed in the test metal pattern 23 at an intermediate position in the thickness direction of the semiconductor wafer 2, as shown in FIG. 5(b). The chuck table 51, that is, the semiconductor wafer 2 is then moved in the direction indicated by the arrow X1 in FIG. 5(a) at a predetermined processing-feed rate while a pulse laser beam of a wavelength having permeability to the semiconductor wafer 2 is applied from the condenser 522. When the application position of the condenser 522 reaches the other end (right end in FIG. 5 (a)) of the semiconductor wafer 2 as shown in FIG. 5(a), the application of the pulse laser beam is suspended, and the movement of the chuck table 51, that is, the semiconductor wafer 2 is stopped. As a result, a deteriorated layer 24 is formed as a dividing start point along the street 21 above the break line 231 formed in the test metal patterns 23 in the inside of the semiconductor wafer 2, as shown in FIGS. 5(b) and 5(c). This deteriorated layer 24 is formed as a molten and re-solidified layer or cracked layer.

The processing conditions in the above deteriorated layer forming step are set as follows, for example.
Light source of laser beam: YVO4 laser or YAG laser
Wavelength: 1,064 nm
Repetition frequency: 300 to 500 kHz
Average output: 0.5 to 3 W
Focal spot diameter: 1 μm
Processing-feed rate: 400 to 800 mm/sec After the above deteriorated layer forming step is carried out along all the streets 21 formed in the predetermined direction of the semiconductor wafer 2, the chuck table 51, therefore, the semiconductor wafer 2 is turned at 90°. The above deteriorated layer forming step is carried out along all the streets 21 formed on the semiconductor wafer 2 in a direction perpendicular to the above predetermined direction. As a result, deteriorated layers 24 are formed along all the streets 21 above the break lines 231 formed in the test metal patterns 23 on all the streets 21 in the inside of the semiconductor wafer 2.

Figure 6:
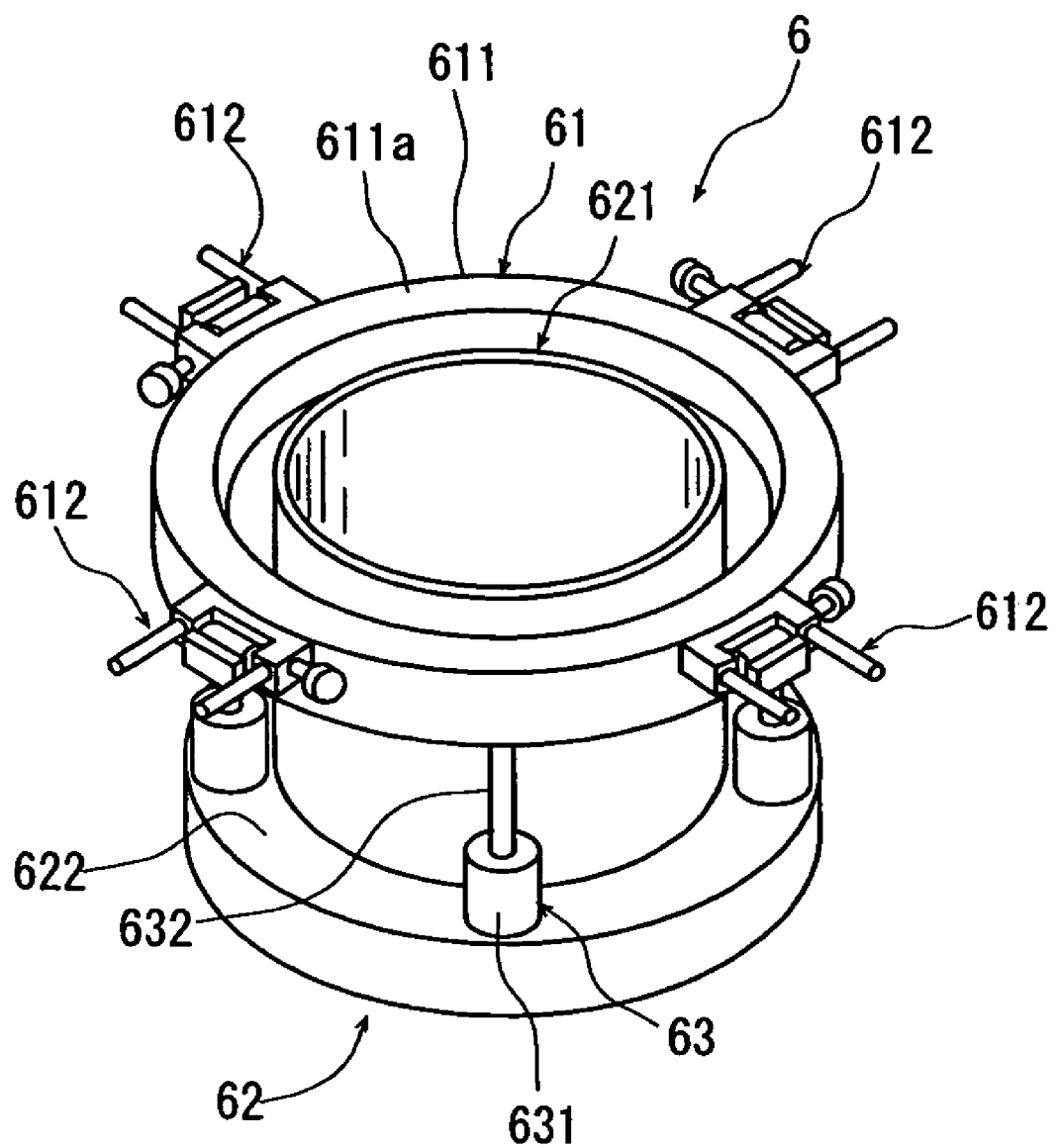
FIG. 6 is a perspective view of an embodiment of a dividing apparatus for carrying out the dividing step in the wafer dividing method of the present invention.

The above deteriorated layer forming step is followed by a dividing step for dividing the semiconductor wafer 2 along the deteriorated layers 24 as the dividing start points by exerting external force to the semiconductor wafer 2. This dividing step is carried out by using a dividing apparatus 6 shown in FIG. 6 in the illustrated embodiment. The dividing apparatus 6 shown in FIG. 6 comprises a frame holding means 61 for holding the above annular frame 3 and a tape expanding means 62 for expanding the support tape 4 mounted on the annular frame 3 held on the frame holding means 61. The frame holding means 61 comprises an annular frame holding member 611 and a plurality of clamp mechanisms 612 as a fixing means arranged around the frame holding member 611. The top surface of the frame holding member 611 serves as a placing surface 611a for placing the annular frame 3, and the annular frame 3 is placed on the placing surface 611a. The annular frame 3 placed on the placing surface 611a is fixed to the frame holding member 611 by the clamp mechanisms 612. The frame holding means 61 thus constituted is supported by the tape expanding means 62 in such a manner that it can move in the vertical direction.

The tape expanding means 62 has an expansion drum 621 arranged in the inside of the above annular frame holding member 611. This expansion drum 621 has a smaller inner diameter than the inner diameter of the annular frame 3 and a larger outer diameter than the outer diameter of the semiconductor wafer 2 put on the support tape 4 mounted on the annular frame 3. The expansion drum 621 has a support flange 622 at the lower end. The tape expanding means 62 in the illustrated embodiment has a support means 63, which can move the above annular frame holding member 611 in the vertical direction. This support means 63 comprises a plurality of air cylinders 631 installed on the above support flange 622, and their piston rods 632 are connected to the undersurface of the above annular frame holding member 611. The support means 63 comprising the plurality of air cylinders 631 moves the annular frame holding member 611 in the vertical direction between a standard position where the placing surface 611a becomes substantially flush with the upper end of the expansion drum 621 and an expansion position where the placing surface 611a is positioned below the upper end of the expansion drum 621 by a predetermined distance. Therefore, the support means 63 comprising the plurality of air cylinders 631 functions as an expanding and moving means for moving the frame holding member 611 relative to the expansion drum 621 in the vertical direction.

Figure 7:
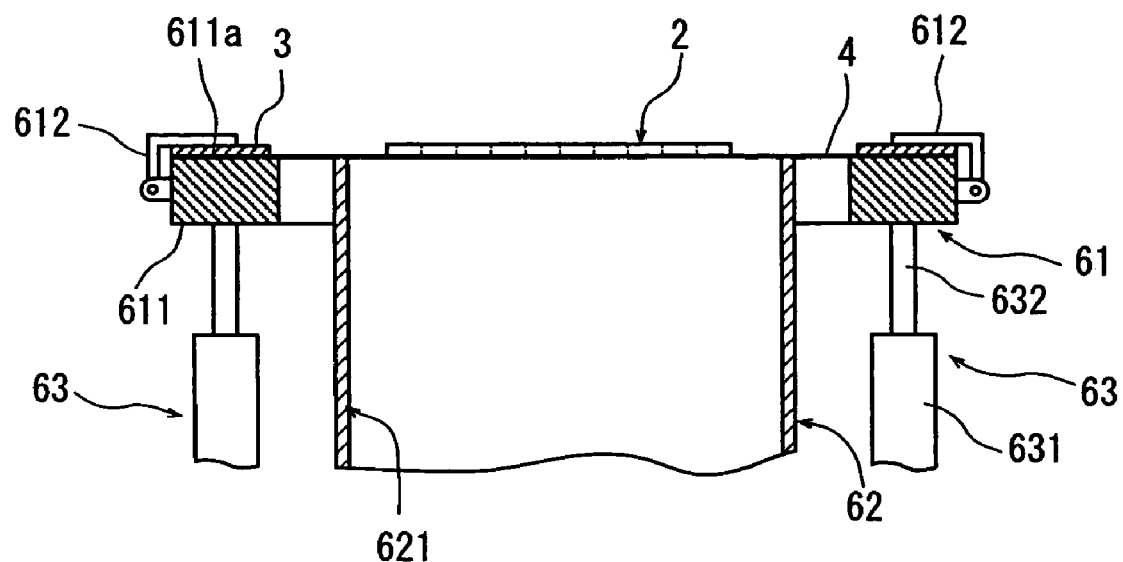
FIGS. 7(a) and 7(b) are explanatory diagrams showing the dividing step in the wafer dividing method of the present invention.
Figure 7:
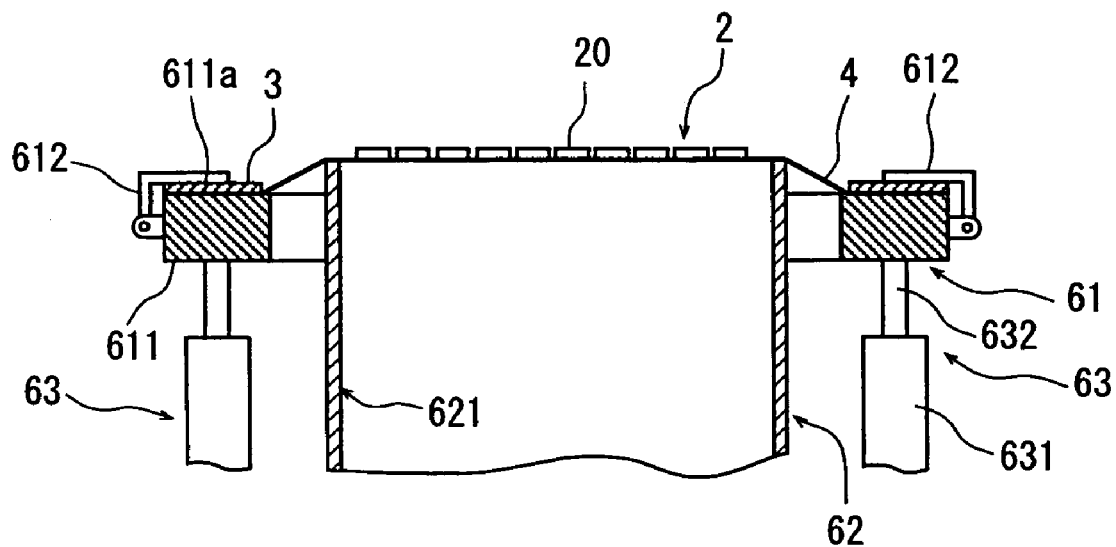

The dividing step which is carried out by using the above constituted dividing apparatus 6 will be described with reference to FIGS. 7(a) and 7(b). That is, the annular frame 3 supporting the semiconductor wafer 2 (the deteriorated layer 24 is formed along the streets 21) through the support tape 4 is placed on the placing surface 611a of the frame holding member 611 constituting the frame holding means 61 and is fixed on the frame holding member 611 by the clamp mechanisms 612, as shown in FIG. 7 (a). At this point, the frame holding member 611 is situated at the standard position shown in FIG. 7 (a). The annular frame holding member 611 is lowered to the expansion position shown in FIG. 7(b) by activating the plurality of air cylinders 631 as the support means 63 of the tape expanding means 62. Therefore, the annular frame 3 fixed on the placing surface 611a of the frame holding member 611 is also lowered, whereby the support tape 4 mounted on the annular frame 3 comes into contact with the upper edge of the expansion drum 621 to be expanded, as shown in FIG. 7(b) (tape expanding step). As a result, tensile force acts radially on the semiconductor wafer 2 put on the support tape 4. When tensile force thus acts radially on the semiconductor wafer 2, the semiconductor wafer 2 is broken along the deteriorated layers 24 as dividing start points because the deteriorated layers 24 formed along the streets 21 have reduced strength, whereby the semiconductor wafer 2 is divided into individual semiconductor chips 20. Since the plurality of test metal patterns 23 formed on the streets 21 are broken along the streets 21 and the break lines 231 are formed in the above metal pattern breaking step at this point, the test metal patterns 23 are not broken like the teeth of a saw. Further, since the test metal patterns 23 are divided and their function is destroyed by the application of the laser beam, the constitution of the devices 22 cannot be detected from the remaining test metal patterns 23.

The following dividing methods may be employed besides the above dividing method.

That is, a method in which the semiconductor wafer 2 put on the support tape 4 (the deteriorated layer 24 is formed along the streets 21) is placed on a soft rubber sheet, and the top surface of the semiconductor wafer 2 is pressed with a roller to divide the semiconductor wafer 2 along the streets 21 whose strength has been reduced by the formation of the deteriorated layers 24 may be employed. Alternatively, a method in which an ultrasonic wave as a longitudinal wave (compressional wave) having a frequency of about 28 kHz is applied along the streets 21 whose strength has been reduced by the formation of the deteriorated layers, a method in which a pressing member is applied along the streets 21 whose strength has been reduced by the formation of the deteriorated layers 24 or a method in which a heat shock is given by applying a laser beam along the streets 21 whose strength has been reduced by the formation of the deteriorated layers 24 may be employed.

What is claimed is:

1. A method of dividing a wafer having a plurality of devices, which are formed in a plurality of areas sectioned by streets formed in a lattice pattern on a front surface and test metal patterns which are formed on the streets, comprising:

a metal pattern breaking step for forming a break line in the test metal patterns by holding the wafer in such a manner that its rear surface faces up and applying a pulse laser beam having permeability to the wafer to the rear surface of the wafer with its focal point set to a position near the test metal patterns;

a deteriorated layer forming step for forming a deteriorated layer along the streets above the break line in an inside of the wafer by applying a pulse laser beam having permeability to the wafer to the rear surface of the wafer with its focal point set to a position above the break line in the inside of the wafer; and a dividing step for dividing the wafer into individual chips along the deteriorated layer of the wafer by exerting external force to the wafer having the deteriorated layer formed therein, wherein the pulse laser beam applied in the metal pattern breaking step has a wavelength of 1,064 nm, a repetition frequency 20 kHz to 80 kHz and an average output of 0.05 W to 0.2 W.

* * * * *